(12) United States Patent  
Venugopal et al.

(10) Patent No.: US 6,493,850 B2
(45) Date of Patent: Dec. 10, 2002

(54) INTEGRATED CIRCUIT DESIGN ERROR DETECTOR FOR ELECTROSTATIC DISCHARGE AND LATCH-UP APPLICATIONS

(75) Inventors: Puvvada Venugopal, Bangalore (IN); Snehamay Sinha, Bangalore (IN); Sridhar Ramaswamy, Plano, TX (US); Charvaka Duvvury, Plano, TX (US); Guru C. Prasad, Bangalore (IN); C. S. Raghu, Scotch Plains, NJ (US); Gopalaro Kadamati, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 09/785,706

(22) Filed: Feb. 16, 2001

(65) Prior Publication Data

US 2002/0152447 A1 Oct. 17, 2002

(51) Int. Cl.[7] .............................................. G06F 17/50
(52) U.S. Cl. ................................. 716/4; 716/14; 716/2
(58) Field of Search .................................. 716/2, 4, 1, 5, 716/14, 15; 703/28, 29; 714/33, 32

(56) References Cited

U.S. PATENT DOCUMENTS

| | | | | |
|---|---|---|---|---|
| 5,383,167 A | * | 1/1995 | Weil | 703/19 |
| 5,949,694 A | * | 9/1999 | Amerasekera et al. | 257/360 |
| 5,960,191 A | * | 9/1999 | Sample et al. | 703/23 |
| 6,058,492 A | * | 5/2000 | Sample et al. | 714/33 |
| 6,080,063 A | * | 6/2000 | Khosla | 463/42 |
| 6,209,123 B1 | * | 3/2001 | Maziasz et al. | 716/11 |
| 6,377,912 B1 | * | 4/2002 | Sample et al. | 703/28 |

* cited by examiner

Primary Examiner—Vuthe Siek
Assistant Examiner—Binh C. Tat
(74) Attorney, Agent, or Firm—Frederick J. Telecky, Jr.; W. James Brady, III

(57) ABSTRACT

For quantitatively identifying sensitivities against electrostatic discharge (ESD) and latch-up in an integrated circuit (IC) design (before the actual IC is fabricated), the disclosed computer system and method combine information from the design netlist, the elements model, a safe operating file, and a list of stress simulations, and apply a simulated, quantified ESD event to the design. The observed sensitivities of the design elements to ESD and latch-up are then quantitatively analyzed, critical stress values are judged, and element failures recorded. Finally, element and location lists of sensitivities and failures are output in a specific format.

10 Claims, 2 Drawing Sheets

INTEGRATED CIRCUIT DESIGN ERROR DETECTOR FOR ELECTROSTATIC DISCHARGE AND LATCH-UP APPLICATIONS

FIELD OF THE INVENTION

The present invention is related in general to the field of electronic systems and semiconductor devices and more specifically to automated systems and methods for modeling integrated circuit characteristics for preventing destructive electrostatic discharge and latch-up.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("Machine Model", MM); it can generate transients with significantly higher rise times than the HBM ESD source. A third source is described by the "Charged Device Model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Other solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat No. 5,940,258, issued Aug. 17, 1999 (Duvvury, "Semiconductor ESD Protection Circuit"); U.S. Pat. No. 6,137,144, issued Oct. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

In general, even good design and fabrication improvement steps are not able to completely eliminate ESD sensitivity of complex circuits. Consequently, predictive modeling at the circuit level has become extremely important since experimental methods require destructive testing, costly failure analysis to determine the effectiveness of a protection scheme, and often a frustrating redesign of the circuit. A first effort in this direction is described in U.S. Pat. No. 5,796,638, issued on Aug. 18, 1998 (Kang et al., "Methods, Apparatus and Computer Program Products for Synthesizing Integrated Circuits with Electrostatic Discharge Capability and Connecting Ground Rules therein"). A software system generates an IC schematic containing power rails and electrical paths interconnecting retrieved circuit elements and I/O pads. The resistances of the electrical paths to the I/O pads are then determined. Lengths and/or widths of the electrical paths and power rails are adjusted to eliminate/correct ground rules faults. The IC schematic is thus updated. The method is inadequate for extracting parasitic devices and considering substrate resistance effects.

Another design and verification effort is described in U.S. Pat. No. 6,086,627, issued on Jul. 11, 2000 (Bass et al., "Method of Automated ESD Protection Level Verification"). Minimum wire width and maximum resistance constraints are applied to each of the chip's I/O ports. These constraints are propagated to the design and then verified; power rails are similarly checked. The method is inadequate for extracting parasitic devices and considering substrate resistance effects.

Modeling examples for designing and analyzing ESD protection circuits and detecting ESD design errors have been described in the papers "Modeling MOS Snapback and Parasitic Bipolar Action for Circuit-Level ESD and High Current Simulations" (by A. Amerasekera, S. Ramaswamy, M.-C. Chang, and C. Duvvury, Proc. Int. Reliab. Phys. Symp. 1996, pp. 318–326; extensive literature reference list), and "An Automated Tool for Detecting ESD Design Errors" (by S. Sinha, H. Swaminathen, G. Kadamati, and C. Duvvury, EOS/ESD Symp. 1998, pp. 208–217). In these papers, a system and flow are outlined to check a given IC design for ESD performance. The impact on detecting faulty IC component values and design errors is illustrated by a number of examples. However, contributions and impact of the substrate resistance network are not considered and options for optimizing the circuit parameters are not offered.

In the recent U.S. patent application Ser. No. 60/258,659, filed Dec. 29, 2000 (Ramaswamy et al., "Semiconductor Device Extractor for Electrostatic Discharge and Latch-up Applications"), a computerized system and method is disclosed for minimizing ESD and latch-up sensitivities in an IC design. This application combines input data from device layout, technology rules and doping profiles in order to extract netlists, element location and substrate resistance, analyze the layout for parasitic device formation. The application outputs lists of ESD- and latch-up sensitive elements and their locations. However, the application cannot simulate an actual ESD event in order to get a quantitative answer about value and location of ESD-sensitive elements. The present invention is related to this patent application.

An urgent need has, therefore, arisen for a coherent, low-cost system and method of quantitatively simulating an ESD event in an IC, while the IC is still in the design stage. The answers should be quantitative, and the system flexible enough for different semiconductor product families and a wide spectrum of design and process variations. Preferably, these innovations should also shorten IC design cycle time.

SUMMARY OF THE INVENTION

For quantitatively identifying sensitivities against electrostatic discharge (ESD) and latch-up in an integrated circuit (IC) design (before the actual IC is fabricated), the disclosed computer system and method combine information from the design netlist, the elements model, a safe operating file, and a list of stress simulations, and apply a simulated, quantified ESD event to the design. The observed sensitivities of the design elements to ESD and latch-up are then quantitatively analyzed, critical stress values are judged, and element failures recorded. Finally, element and location lists of sensitivities and failures are output in a specific format.

The present invention is related to high density ICs, especially those to be used at very high frequencies and having high numbers of input/outputs, tight design and layout rules, and a complex flow of fabrication steps. These ICs can be found in many semiconductor device families such as microprocessors, digital signal processors, standard linear and logic products, digital and analog devices, high frequency and high power devices, wireless and both large and small area chip categories. Since the invention aims at designing devices with minimum geometries and high reliability, it supports continually shrinking applications such as cellular communications, pagers, hard disk drives, laptop computers and medical instrumentation.

It is an aspect of the present invention to provide an automated system and method for detecting IC design errors relative to ESD and latch-up. This aspect is achieved by processing a pre-determined ESD event through the design and monitoring quantitatively the susceptibility to ESD failure models.

Another aspect of the present invention is to provide a quantitative and highly flexible system and method. This aspect is achieved by the embodiments of two subsystems of the invention:

A pre-processor drawing inputs from four sources:
  a netlist from one of two independent input sources, namely an IC layout file or an IC schematic file;
  a model of elements including parasitic, ESD- and latch-up-sensitive elements;
  safe circuit operating conditions relative to ESD and latch-up stability; and
  customized stress simulation conditions relative to ESD and latch-up applications.

A post-processor operable to
  quantitatively analyze the sensitivities of the design elements relative to ESD and latch-up;
  critically judge the observed stress values; and
  record any observed element failures.

Another aspect of the present invention is to provide the computer system output in specific formats or displays directly useful to circuit designers. This aspect has been achieved by the embodiment of an output generator which creates a report of the observed ESD and latch-up sensitivities including an element list and a location list of the element failures. The output is expressed in a specific format useful to IC designers.

Another aspect of the present invention is to introduce computer concepts which are flexible so that they can be applied to several performance criteria of integrated circuits relative to ESD and latch-ups, and are general so that they can be applied to several generations of products.

These aspects have been achieved by teachings and embodiments of the invention. Various modifications have been successfully employed to satisfy different selections of product geometries, processes and characteristics. The method of the invention provides easy expansion to new IC designs, and easy specialization to customer-specific requirements.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. application Ser. No. 60/258,659, filed Dec. 29, 2000 (Ramaswamy et al., "Semiconductor Device Extractor for Electrostatic Discharge and Latch-up Applications"), and to U.S. Pat. No. 5,949,694, issued Sep. 7, 1999 (Amerasekera et al., "Method and System for Extracting High Current Parasitic Bipolar Transistor Parameters of an MOS Device during Overvoltage Events"), which are herewith incorporated by reference.

The present invention satisfies the electrostatic discharge (ESD) needs in the semiconductor industry as summarized in the paper "ESD: Design for IC Chip Quality and Reliability" (C. Duvvury, Int. Symp. Quality in E1. Designs, 2000, pp. 251–259). The needs can be stated as:
  Perform circuit simulations to simulate HBM, MM, and CDM ESD events on any piece of circuit and identify ESD failure in devices;
  simulate the effect any circuit change has on ESD failure, which helps in faster design of ESD-robust circuits to optimize the circuit parameters, like MOS widths and gate lengths, to achieve the best conditions for avoiding ESD failure;

analyze the elements of the circuit design quantitatively for latch-up sensitivity as well as for ESD sensitivity; and characterize the identified sensitivities by design element list and location list for easy correction of the identified errors.

Figure 1:
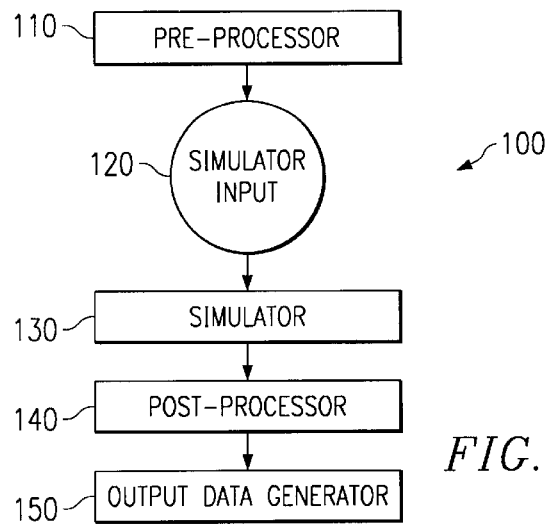
FIG. 1 illustrates a block diagram of a computerized system for detecting design errors in order to check semiconductor circuit designs for electrostatic discharge and latch-up sensitivities.

As illustrated schematically in the simplified block diagram of FIG. 1, the system of the present invention, generally designated 100, operates to automatically select inputs from several files, compiles them as inputs to an simulator, performs the quantitative stress simulation, analyzes IC elements quantitatively for ESD and latch-up sensitivities, and outputs the results as an element list and a location list in a format suitable for circuit design corrections.

A pre-processor 110 is capable to obtain information from a number different files for layout, schematic, elements model, safe operating rules, and stress simulation conditions, all expressed in a specific format. Pre-processor 110 is connected to the simulator input file 120, capable of storing the inputs as modified for ESD and latch-up applications, including statements used for identifying ESD and latch-up failures, as an ESD netlist expressed is a specific format, such as SPICE. These data are then used as inputs for the stress simulator 130.

The stress simulator 130 applies simulated, carefully quantified ESD stress events to the modified netlist pulled down from the simulator input 120; it then processes this event through the IC design elements. The sensitivities of the design elements relative to ESD and latch-up, observed by the simulator 130, are quantitatively analyzed by the post-processor 140, connected to the simulator 130. This post-processor 140 judges critical stress values and records any observed element failures.

The post-processor 140 is connected to the output generator 150, which creates a report of the observed ESD and latch-up sensitivities and expresses the report in a user-oriented format. The report contains an element list as well as a location list of the observed element failures.

The device extractor system 100 can automatically and quickly detect IC design errors relative to ESD and latch-up, before any actual semiconductor chips are fabricated. By identifying elements and structures sensitive to ESD and latch-up, the system thus offers the IC designer a chance to improve questionable design structures while corrections are still easy and inexpensive. System 100 is flexible and can be used for any ICs manufactured by bipolar, MOS and CMOS technologies. For an embodiment in a computer system, examples of the requirements are as follows:

| ** Hardware: | | |
|---|---|---|
| * Platform/Model | SUN SPARC station, such as 4/60, 4/65, 4/75 HP 9000 Series 700, such as 710, 720 | |
| * Memory | 64 Mbytes | |
| * Disk | 100 Mbytes minimum | |
| * Peripherals | None | |
| ** Software: | | |
| * Operating System | SOLARIS 2.5 and above HP 9000 Series 700, such as HP-UX 9.X Any X Window ™ Manager | |
| * Technology | Independent | |
| * Input | CADENCE Composer ™, layout MENTOR Graphics Design Architect ™, netlists K2 Technologies, layout verification | |
| * Output | SPICE ("Simulation Program with Integrated Circuit Emphasis") for use with IC designs | |

The "Layout Verification" program is commercially available from K-2 Technologies, Dallas, Tex., USA.

Figure 2:
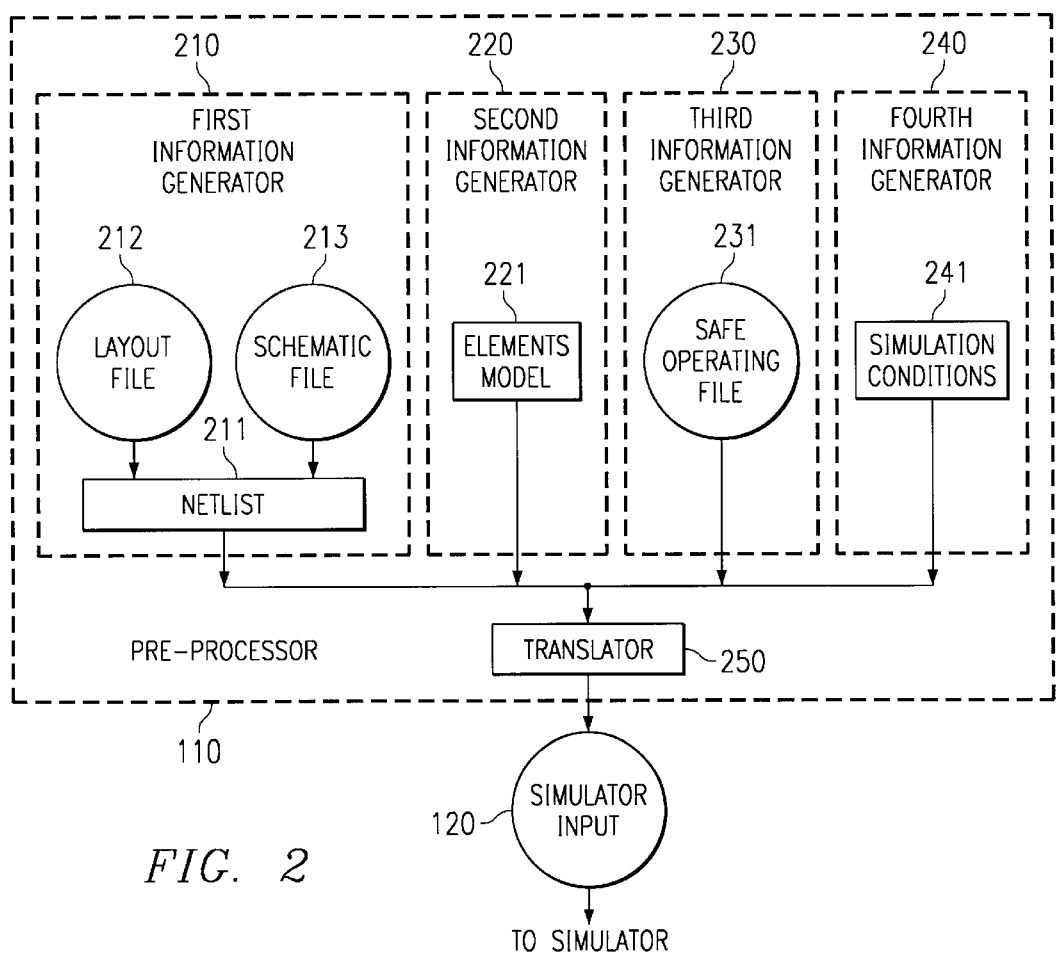
FIG. 2 illustrated a block diagram of the detail of the pre-processor of the computerized system according to the invention.

An embodiment of the pre-processor computer system of the present invention is illustrated in more detail by the schematic block diagram of FIG. 2. The major parts of the pre-processor are, analogous to FIG. 1, the pre-processor 110 itself and the simulator input file 120.

The pre-processor 110 has the first information generator 210, the second information generator 220, the third information generator 230, and the fourth information generator 240. These input generators are distinguished by the categories of data they provide and are responsible for the flexibility to various process technologies and stress testing levels. The first information generator 210 creates a netlist 211 from one of two independent input sources: an IC layout file 212 or an IC schematic file 213. The netlist 211 is typically expressed in a format like SPICE. The pre-processor 110 is a program that will alter the SPICE deck to make it ready for ESD simulations.

The second information generator 220 selects data related to a model 221 of elements including parasitic, ESD- and latch-up sensitive elements. Among many others, such data include, for example, different mask levels for the selected technology, minimum spacing between different layers, sheet resistances, silicided parts/information, channel lengths, epitaxial parts/information, design shrink factors, and ESD-specific values. Furthermore, the data include electrical characteristics of the elements mentioned. Such information is used to create the process and design-specific elements model 221, emphasizing ESD and latch-up aspects.

The third information generator 230 selects data from a file storing the circuit safe operating conditions relative to ESD and latch-up stability. The fourth information generator 240 creates data related to customer-defined stress simulation conditions 241, as they apply to ESD and latch-up scenarios.

For the four information generators 210, 220, 230 and 240, the computerized system prompts the user to give inputs containing various options. A few examples from the plurality of these selections, as related to ESD characteristics, are:

Selecting values for It2, measured in mA/$\mu$m, for NMOS and PMOS devices. The second (thermal) breakdown trigger current It2 is very sensitive to the device design, especially the doping profiles. A number of effects (such as the increase of intrinsic carrier concentration, a reduced carrier mobility, a decrease in thermal conductivity, and a lowering of the potential barrier for tunnel currents) contribute to the onset of second breakdown. Second breakdown results in junction melting an in an irreversible increase in leakage current.

Specifying the pads between which ESD strikes takes place.

Deciding on placing high resistors to nodes "0" from all floating pads.

Turning on the selected ESD model to all MOS devices.

Adding substrate resistance values for all MOS devices.

Calculating the failure currents of the MOS devices with the value of It2·width of device.

Adding the equivalent circuit for ESD model selected (HBM, MM, CDM).

Connecting ground node to zero.

Adding Vcc capacitance.

Specifying any further modifications.

The combined data from the four information generators 210, 220, 230, and 240 are expressed by the translator 250 in a unified specific format, such as SPICE, and forwarded to, and stored in, the simulator input file 120. Due to its function, the simulator input file is also called the "ESD SPICE netlist". As pointed out above, the simulator input file 120 is modified to include circuits equivalent to the HBM, the MM, and the CDM, as well as other relevant statements used to identify ESD and latch-up failures.

The simulator input file 120, in turn, is coupled to the simulator 130. It is a key feature of the present invention that the simulator 130 is structured to administer ESD stress events in pre-determined quantitative steps. The results of these simulated quantitative ESD strikes are then analyzed by the post-processor 140, which is coupled to the simulator 130.

Figure 3:
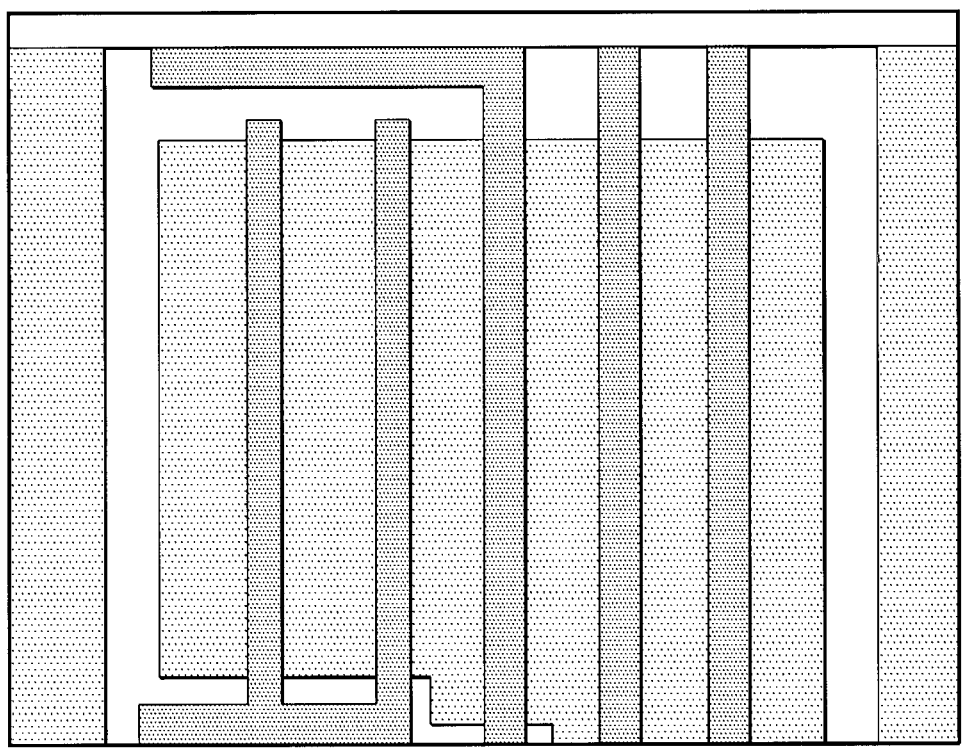
FIG. 3 illustrates the portion of the layout of an I/O cell in an IC design identified as a weak spot by ESD computer simulation.
Figure 4:
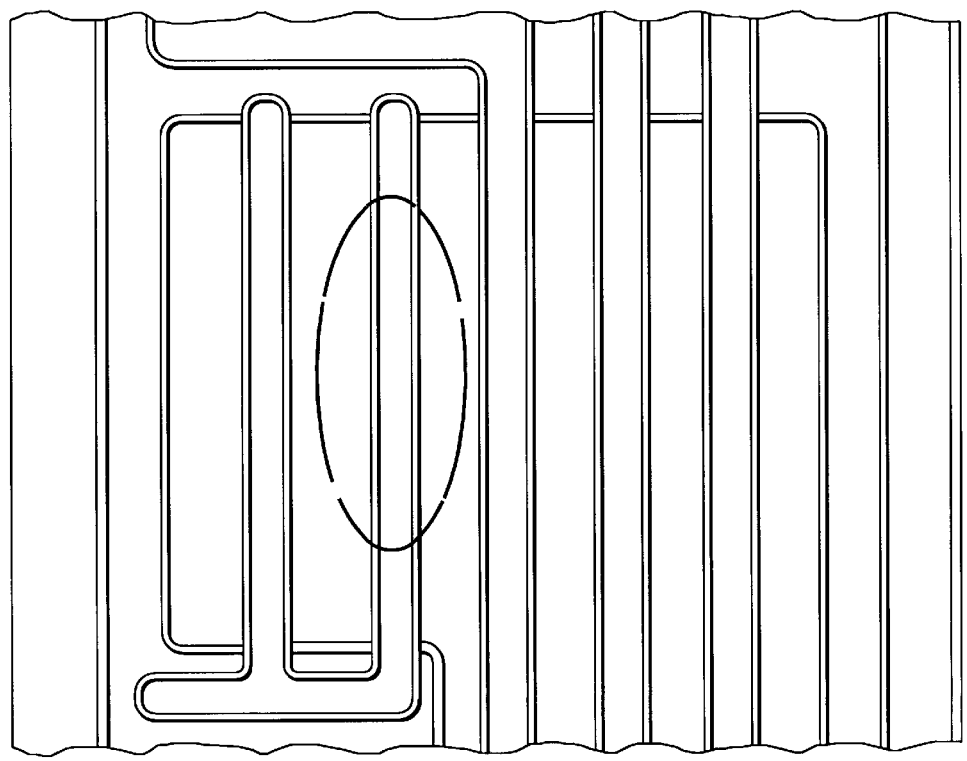
FIG. 4 is a photograph of the same cell as in FIG. 3 after IC fabrication and after applying an actual ESD strike, indicating the same failure location identified in FIG. 3.

How successful such quantitative SPICE simulation runs with ESD model and subsequent quantitative analysis can be in terms of identifying ESD sensitivities of the design, is illustrated by the example in FIGS. 3 and 4. FIG. 3 shows the layout of a library cell in a small portion of an IC (GS30 OUO231 cell). Two elongated conductive features of an MOS transistor are characterized by their x-y location markers. The geometry of these features and the process steps selected for their fabrication were used as inputs into the computer program of simulator 130. At an ESD strike of 4187 V, no ESD violation was found. However, at an ESD strike of 4343 V, an ESD violation was predicted, with It2=0.081 A peak current and a start fail time of 10 ns. The IC design of FIG. 3 was later produced in manufacturing and subjected to ESD strikes. The photograph of FIG. 4 shows the same IC library cell as FIG. 3 after an actual ESD strike of 4250 V. The ESD-initiated failure is clearly visible within the cell. The simulation run has thus identified the location of the failure and determined the coordinates of the sensitive device.

In general, the post-processor 140, coupled to simulator 130, analyzes quantitatively the sensitivities of the IC design elements relative to ESD and latch-up, judges critical stress values, and records any element failures. Specifically, the post-processor outputs the following violations:

It flags all MOS devices where I>It2 for that device (It2 is the current through the MOS device at which it fails);

it flags all MOS devices where Vgd/Vgs>Vox.br (Vox.br is the breakdown voltage of the oxide);

it flags all resistors where Vres>Vres.max (Vres.max is the maximum voltage that a resistor can handle);

it flags all ESD devices that have not turned on. When an ESD device has not turn on, it indicates potential problems with the I/O buffers.

it provides support on convergence problems by checking if Rsource and Rdrain are provided in the model card;

changing maximum time step on .trans (transient), 1 ps to 0.1 ns;

changing tratol (transient tolerance) on options, up to max 1E-5;

changing tol (tolerance) on .options, up to 1E-4.

The post-processor 140 is coupled to the output data generator 150. It creates a text file which contains the names of the devices failing ESD strike or latch-up, together with the coordinates of the devices in the layout (element list and location list). Furthermore, the output generator provides a listing of the current and voltage threshold values, the current and voltage peaks observed values, and the failure start times. The output is in a format directly useful to circuit designers.

The computer-implemented process flow for quantitatively identifying ESD and latch-up sensitivities in an IC design comprises the following steps:

generating information from a design netlist, an elements model, a file of circuit safe operating conditions, and a list of stress simulation. In more detail, this step comprises the steps of:

generating data as a design netlist from one of two independent input sources, an IC layout file or an IC schematic file;

generating data related to an electrical model of elements including parasitic, ESD- and latch-up-sensitive elements;

generating data related to IC safe operating conditions relative to ESD and latch-up stability; and generating data related to customized stress simulation conditions relative to ESD and latch-up applications;

combining said information into a program and expressing said program in a specific format modified for ESD and latch-up simulations;

storing said modified program, including statements used for identifying ESD and latch-up failures, as an ESD netlist expressed in a specific format;

applying a simulated, quantified ESD event to said modified program of said IC design and processing said event through said design elements;

analyzing quantitatively the sensitivities of said design elements relative to ESD and latch-up, judging critical stress values, and recording any element failures; and creating a report, expressed in a specific format, of said sensitivities, including an element list and a location list of said element failures.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A computerized system for quantitatively identifying electrostatic discharge (ESD) and latch-up sensitivities in an integrated circuit (IC) design, comprising:

a pre-processor operable to collect information from a netlist, an elements model, a file of circuit safe operating conditions, and a list of stress simulation conditions, to express the combined program in a specific format modified for ESD and latch-up simulations;

a simulator input data file coupled to said pre-processor, operable to store said modified program, including statements used for identifying ESD and latch-up failures, as an ESD netlist expressed in a specific format;

a simulator coupled to said simulator input file, operable to apply a simulated, quantified ESD stress event to said modified program of said IC design, and to process said event through said design elements;

a post-processor coupled to said simulation program, operable to quantitatively analyze the sensitivities of said design elements relative to ESD and latch-up, to judge critical stress values and to record any element failures; and an output data generator coupled to said post-processor, operable. to create a report, expressed in a specific format, of said sensitivities including an element list and a location list of said element failures.

2. The system according to claim 1 wherein said specific format is the SPICE format.

3. The system according to claim 1 wherein said pre-processor comprises:

a first information generator operable to generate data as a netlist from one of two independent input sources, an IC layout file or an IC schematic file;

a second information generator operable to generate data related to a model of elements including parasitic, ESD- and latch-up-sensitive elements;

a third information generator operable to generate data related to safe circuit operating conditions relative to ESD and latch-up stability;

a fourth information generator operable to generate data related to customized stress simulation conditions relative to ESD and latch-up applications; and a translator operable to express said combined data in a unified specific format.

4. The system according to claim 3 wherein said safe operating conditions comprise a plurality of options, including specified element locations and element values characterizing ESD and latch-up stability.

5. The system according to claim 1 wherein said statements For ESD failures include circuits equivalent to the Human Body Model, the Machine Model, and the Charged Device Model.

6. The system according to claim 1 wherein said simulator is operable to apply said quantified ESD stress events in selectively increased stress steps, whereby the degree of ESD sensitivity can be quantitatively determined.

7. The system according to claim 1 wherein said post-processor comprises a program operable to flag circuit elements and devices which fail to withstand the quantitative ESD stress events, said failures including electrical values outside predetermined tolerance limits, unacceptable device characteristics, or the inability to operate as expected.

8. A computer-implemented method of quantitatively identifying electrostatic discharge (ESD) and latch-up sensitivities in an integrated circuit (IC) design, comprising the steps of:

generating information from a design netlist, an elements model, a file of circuit safe operating conditions, and a list of stress simulation;

combining said information into a program and expressing said program in a specific format modified for ESD and latch-up simulations;

storing said modified program, including statements used for identifying ESD and latch-up failures, as an ESD netlist expressed in a specific format;

applying a simulated, quantified ESD event to said modified program of said IC design and processing said event through said design elements;

analyzing quantitatively the sensitivities of said design elements relative to ESD and latch-up, judging critical stress values, and recording any element failures; and creating a report, expressed in a specific format, of said sensitivities, including an element list and a location list of said element failures.

9. The computer-implemented method according to claim 8 wherein said specific format is the SPICE format.

10. The computer-implemented method according to claim 8 wherein said step of generating information comprises the steps of:

generating data as a design netlist from one of two independent input sources, an IC layout file or an IC schematic file;

generating data related to a model of elements, including parasitic, ESD- and latch-up-sensitive elements;

generating data related to IC safe operating conditions relative to ESD and latch-up stability; and generating data related to customized stress simulation conditions relative to ESD and latch-up applications.

* * * * *